United States Patent [19]
Kalb et al.

[11] Patent Number: 5,939,938
[45] Date of Patent: Aug. 17, 1999

[54] AMPLIFIER CIRCUIT WITH REDUCED DC POWER RELATED TURN-ON AND TURN-OFF TRANSIENTS

[75] Inventors: Arthur Joseph Kalb, San Jose; Christopher Bernard Heithoff, Santa Clara, both of Calif.

[73] Assignee: National Semiconductor Corporation, Sata Clara, Calif.

[21] Appl. No.: 08/928,036

[22] Filed: Sep. 11, 1997

Related U.S. Application Data

[63] Continuation-in-part of application No. 08/609,726, Mar. 1, 1996, Pat. No. 5,703,529, which is a continuation-in-part of application No. 08/542,596, Oct. 13, 1995, Pat. No. 5,642,074, and application No. 08/546,910, Oct. 23, 1995, Pat. No. 5,648,742.

[51] Int. Cl.$^6$ ..................................................... H03F 1/26
[52] U.S. Cl. ............................ 330/51; 330/110; 330/149; 330/282; 381/94.5; 381/121
[58] Field of Search ................................ 330/51, 86, 110, 330/149, 282; 381/94.5, 121

[56] References Cited

U.S. PATENT DOCUMENTS

| | | | |
|---|---|---|---|
| 4,433,306 | 2/1984 | Honda et al. | 330/297 |
| 4,983,927 | 1/1991 | Torazzina | 330/51 |
| 5,363,062 | 11/1994 | Nebuloni et al. | 330/296 |
| 5,420,535 | 5/1995 | Nebuloni et al. | 330/51 |
| 5,642,074 | 6/1997 | Ghaffaripour et al. | 330/51 |
| 5,648,742 | 7/1997 | Ghaffaripour et al. | 330/51 |

FOREIGN PATENT DOCUMENTS

| | | | |
|---|---|---|---|
| 57-170607 | 4/1981 | Japan | H03F 1/34 |

OTHER PUBLICATIONS

U.S. Patent Application No. 08/609,726, filed Mar. 1, 1996, entitled "Amplifier Circuit with Reduced DC Power Related Transients".

*Primary Examiner*—James B. Mullins
*Attorney, Agent, or Firm*—Limbach & Limbach L.L.P.

[57] ABSTRACT

An amplifier circuit with improved turn-on and turn-off transient operation includes a differential amplifier and a selectively variable reference generator for controlling the amplifier output during circuit turn-on. The amplifier has differential inputs which are driven by a reference voltage from the reference generator and a single-ended input signal. During circuit turn-on, the selectively variable reference voltage, generated by charging the bypass capacitor with a constant current source, charges in a linear manner from ground potential toward its final value of, typically, half of the power supply voltage. During circuit turn-off, the bypass capacitor is discharged with a constant current source in a linear manner toward ground potential. This allows improved turn-on and turn-off transient operation to be realized, e.g. reduced "pops" and "clicks" upon circuit turn-on and turn-off, while giving the user increased flexibility in selecting the sizes of the reference voltage bypass capacitor and the input signal coupling capacitor.

48 Claims, 13 Drawing Sheets

AMPLIFIER CIRCUIT WITH REDUCED DC POWER RELATED TURN-ON AND TURN-OFF TRANSIENTS

RELATED APPLICATIONS

This is a Continuation-In-Part of U.S. patent application Ser. No. 08/609,726, filed Mar. 1, 1996, now U.S. Pat. No. 5,703,529, issued Dec. 30, 1997, and entitled "Amplifier Circuit With Reduced DC Power Related Transients," which in turn is a Continuation-In-Part of U.S. patent application Ser. No 08/542,596, filed Oct. 13, 1995, now U.S. Pat. No. 5,642,074, issued Jun. 24, 1997, and entitled "Amplifier Circuit With Reduced Turn-On And Turn-Off Transients," and of U.S. patent application Ser. No. 08/546,910, filed Oct. 23, 1995, now U.S. Pat. No. 5,648,742, issued Jul. 15, 1997, and entitled "Amplifier Circuit With Reduced Turn-On And Turn-Off Transients."

BACKGROUND OF THE INVENTION

1. Field of the Invention

The present invention relates to analog amplifier circuits, and in particular, to DC-powered, analog amplifier circuits for receiving DC- or AC-coupled input signals and producing DC- or AC-coupled output signals.

2. Description of the Related Art

Referring to FIG. 1, analog amplifiers, such as audio power amplifiers, are often required to operate from a single power supply. In some cases, this means the AC input signal (VIN) must be AC-coupled to the input of the amplifier circuit since the internal reference for the amplifier circuit is at a DC voltage between DC circuit ground and the power supply potential, e.g. at a value equal to one-half of the applied DC power supply voltage. This DC reference is established by a voltage source, often in the form of a resistive voltage divider ($R_1$ and $R_2$) with a bypass capacitor ($C_B$) for charging to and maintaining the DC reference voltage across the lower resistor. (In this particular circuit, as is often the case for audio power amplifiers, two serially cascaded inverting amplifiers are used in a bridge-tied-load ("BTL") configuration to drive a load, e.g. a speaker, with a differential output signal.)

However, this type of circuit suffers from a problem due to the necessity of having an AC-coupled input. Upon application of DC power (V+) to this circuit, the bypass capacitor begins to charge, as does the input coupling capacitor ($C_C$) which is grounded at the input side by the output impedance of the grounded input signal source. This results in the two capacitors having, at any given points in time during their charging or discharging periods, different voltages across them. In turn, this causes a transient signal to appear across the load. For example, during initial circuit turn-on, the current for charging the input coupling capacitor flows from the output of the first amplifier through its feedback ($R_{F1}$) and input ($R_{I1}$) resistors. The resulting signal at the output of the first amplifier appears at the load in the "negative" portion (VOUT−) of the differential output signal, with the "positive" portion (VOUT+) applied by the second, cascaded inverting amplifier. This initial signal across the load is a turn-on transient which in the case of an audio power amplifier produces a "click" or "pop" from the speaker. Similarly, during circuit turn-off, a turn-off transient produced by unequal discharging of the capacitors may produce a "click" or "pop" from the speaker as well.

Similar turn-on and turn-off transients occur in single-ended load ("SEL") circuits, i.e. those amplifier circuits in which a single-ended output signal is provided to a grounded load (e.g. either VOUT− or VOUT+ only) rather than a differential output signal to a load isolated from circuit ground. Indeed, whereas in a BTL configuration the outputs may track each other during startup and thereby avoid producing a "pop," an SEL configuration will virtually always produce a "pop" unless the output bias reference is at DC ground.

Conventional amplifier circuits have been developed which address this "pop" problem in a number of different ways. One approach has been to avoid using single power supply circuits by biasing the amplifier circuit between equal positive and negative power supply voltages with the output driving a grounded load. This allows the input coupling capacitor to be eliminated, thereby eliminating the cause of the turn-on and turnoff transients. However, this requires a second power supply which increases system complexity and costs. Another approach has been to apply the single DC power supply voltage in a gradual manner to initiate the flow of DC bias currents within the amplifiers. However, this results in the amplifier circuit having an indeterminate state of operation during turn-on and turn-off. Further, turn-on and turn-off transients can still occur when power is removed and quickly reinstated as in when a system reset is performed.

Accordingly, it would be desirable to have an analog amplifier which can be operated with a single power supply and reduced DC power related transients.

SUMMARY OF THE INVENTION

An amplifier circuit for operating with a selectively variable reference voltage for reducing turn-on and turn-off transients in accordance with the present invention significantly reduces transients in its output signal due to circuit turn-on and turn-off while providing increased flexibility in the selection of values for the reference voltage bypass capacitor and the input signal coupling capacitor. Output signal transients during circuit turn-on and turn-off are more easily predicted due to simpler relationships between circuit variables and the transient output signal waveform, and circuit turn-on and turn-off times can be decreased with less significant increases in output signal transients.

An amplifier circuit for operating with a selectively variable reference voltage for reducing turn-on transients in accordance with one embodiment of the present invention includes an amplifier and a reference generator. The amplifier is configured to be biased between a power supply voltage and a circuit ground potential, receive a reference voltage having a selectively variable magnitude and receive an input signal and in accordance therewith provide an output signal with a magnitude which varies in relation to and is approximately equal to a sum of the reference voltage and a selected multiple of the input signal. The reference generator is coupled to the amplifier and configured to provide the reference voltage. During a turn-on time period, the reference voltage magnitude changes linearly from approximately the circuit ground potential toward a fixed reference voltage magnitude. During an on-time period subsequent to the turn-on time period, the reference voltage remains at the fixed reference voltage magnitude. During a turn-off time period, the reference voltage magnitude changes linearly from the fixed reference voltage magnitude toward the circuit ground potential. During a turn-off time period subsequent to the on-time period, the reference voltage magnitude changes linearly from the fixed reference voltage magnitude toward the circuit ground potential. During an off time period subsequent to the turn-off time period, the reference voltage remains at approximately the circuit ground potential.

In accordance with another embodiment of the present invention, the amplifier has a gain associated therewith which is controlled by a control signal. The amplifier gain, in accordance with the control signal, causes the selected multiple of the input signal to be approximately zero during the turn-on and turn-off time periods.

In accordance with still another embodiment of the present invention, the amplifier is further configured to operate in a plurality of modes of operation to provide the output signal. The plurality of modes of operation is controlled by a control signal such that during the turn-on and turn-off time periods the reception of the input signal by the amplifier is disabled and the selected multiple of the input signal is approximately zero and further such that during the on-time period the selected multiple of the input signal is enabled to be non-zero.

These and other features and advantages of the present invention will be understood upon consideration of the following detailed description of the invention and the accompanying drawings.

DETAILED DESCRIPTION OF THE INVENTION

Figure 2:
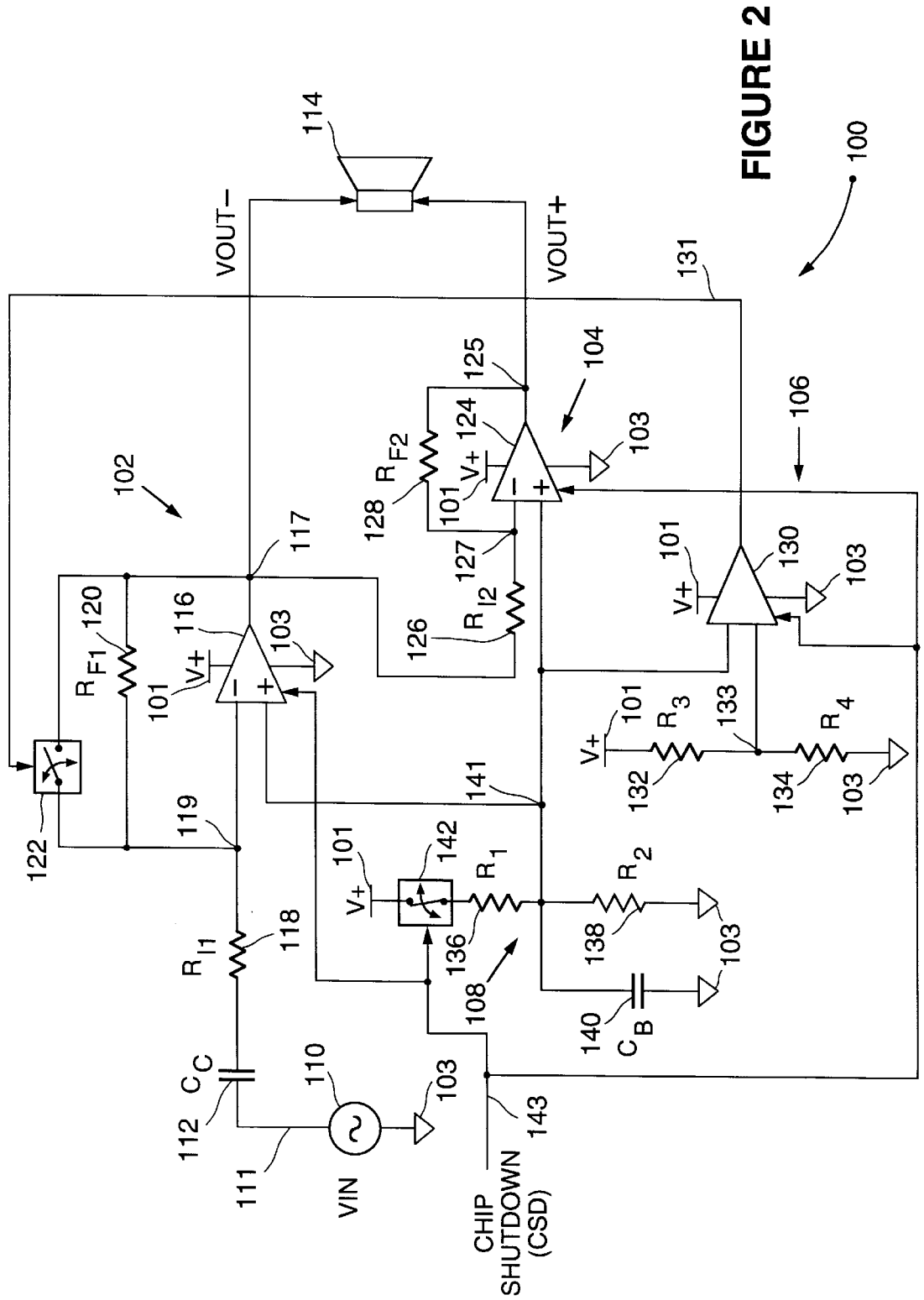
FIG. 2 is a schematic diagram of an analog amplifier circuit including features in accordance with one embodiment of the present invention.

Referring to FIG. 2, an amplifier circuit 100 including features in accordance with one embodiment of the present invention includes a first amplifier 102, a second amplifier 104, a controller 106 and a reference generator 108. As discussed in more detail below, the first amplifier 102 has a controllable gain which is controlled by the controller 106. Based upon the values of two reference voltages provided by the reference generator 108, the controller 106 establishes the gain of the first amplifier 102. The amplifier circuit 100 is driven by an AC signal source 110 through a coupling capacitor 112 and drives a load 114, e.g. a speaker. The first amplifier 102 provides an output signal VOUT− which drives the input to the second amplifier 104 and the load 114. The second amplifier 104 is an inverting amplifier with a gain of unity and provides an output signal VOUT+ which is substantially equal in magnitude and inverse in phase to the first output signal VOUT−. These two output signals VOUT−, VOUT+ form the "positive" and "negative" phases of a differential output signal provided to the load 114. It should be understood, however, that in accordance with the following discussion and the present invention, the load 114 can, alternatively, be a grounded load (e.g. an ac-grounded load, or a dc-grounded load which is capacitively coupled to the amplifier output) which is driven by only the output signal VOUT− from the first amplifier 102. (Although the following discussion is in terms of an inverting amplifier, it should be understood that the principles of the present invention are equally applicable to a noninverting amplifier as well.)

The first amplifier 102 includes an operational amplifier (Op-Amp) 116, an input resistor 118, a feedback resistor 120 and feedback switch 122 (discussed in more detail below), connected substantially as shown. Similarly, the second amplifier 104 includes an Op-Amp 124, an input resistor 126 and feedback resistor 128, connected substantially as shown. In accordance with well known Op-Amp principles, the two amplifiers 102, 104 are inverting amplifiers with their respective voltage gains determined by the ratios of their feedback resistors to their input resistors. As noted above, the second amplifier 104 has a gain of one (unity). Therefore, its input 126 and feedback 128 resistors have equal values ($R_{I2}=R_{F2}$). The input 118 and feedback 120 resistors for the first amplifier 102 can be selected to provide the desired signal gain for the amplifier circuit. The controller 106 includes a voltage comparator 130. The reference generator 108 includes a first resistive voltage divider consisting of serially connected resistors 136, 138, a switch 142 and a bypass capacitor 140, plus a second resistive voltage divider consisting of two serially connected resistors 132, 134, all connected substantially as shown.

During initial turn-on of the amplifier circuit 100, the switch 142 is closed (per a control signal 143) and the power supply 101 voltage V+ is applied to the Op-Amps 116, 124, comparator 130 and reference resistors 136, 138, 132, 134. (The control signal 143 is a chip shutdown signal which is used, as shown, to control the turn-on and turn-off of the Op-Amps 116, 124, as well as the comparator 130, e.g. in accordance with the technique disclosed in copending, commonly assigned U.S. patent application Ser. No. 08/168,448, entitled "Click/Pop Free Bias Circuit" and filed on Dec. 17, 1993, the disclosure of which is hereby incorporated by reference.) Accordingly, the primary reference voltage 141 across the bypass capacitor 140 is initially zero due to the initially discharged state of the bypass capacitor 140 and begins to charge toward its steady state value based upon the ratio of the lower resistor 138 to the sum of the resistors 136, 138. Meanwhile, however, the secondary reference voltage 133 is at its full value immediately, as determined by the ratio of the lower resistor 134 to the sum of the resistors 132, 134. (As discussed in more detail below, the secondary reference voltage 133 is typically selected to be slightly less than the fully charged value of the primary reference voltage 141.) The comparator 130 compares these two reference voltages 141, 133 and provides an output control signal 131 to the switch 122 in the first amplifier 102 based upon such comparison.

Initially, as long as the primary reference voltage 141 is less than the secondary reference voltage 133, the control signal 131 causes the feedback switch 122 to be in its closed, e.g. shorted, state, thereby bypassing the feedback resistor 120. This causes the first amplifier 102 to function as voltage follower with respect to its non-inverting input which receives the primary reference voltage 141. Therefore, its output voltage 117 is equal to its input voltage, i.e. the primary reference voltage 141. This results in equal voltages being applied to the inverting and non-inverting inputs of the second Op-Amp 124, thereby causing its output voltage 125 to also equal the primary reference voltage 141. Accordingly, the two output signals VOUT−, VOUT+ to the load 114 are equal, thereby resulting in a net zero differential signal to the load 114.

Eventually, the primary reference voltage 141 charges up to and surpasses the secondary reference voltage 133. The comparator 130 senses this and adjusts its output control signal 131 accordingly. When the primary reference voltage 141 exceeds the secondary reference voltage 133 the comparator control signal 131 causes the bypass switch 122 to operate in its open, e.g. high impedance, state, thereby no longer bypassing the feedback resistor 120. The amplifier circuit 100 is then configured for its normal, steady-state AC signal operation. The AC input signal 111, coupled through the coupling capacitor 112, is amplified by the amplifiers 102, 104 and applied to the load 114.

As should be understood from the foregoing discussion, with a virtually net zero differential signal applied across the load 114, virtually no turn-on transients are presented to the load 114. Similarly, it should be understood that where the load 114 is a grounded load and a single-ended output signal (i.e. either VOUT− or VOUT+) is applied thereto, virtually no turn-on transients occur. During turn-on, the output signal equals the primary reference voltage 141 which is initially zero and then subsequently a slowly charging DC voltage.

Figure 3:
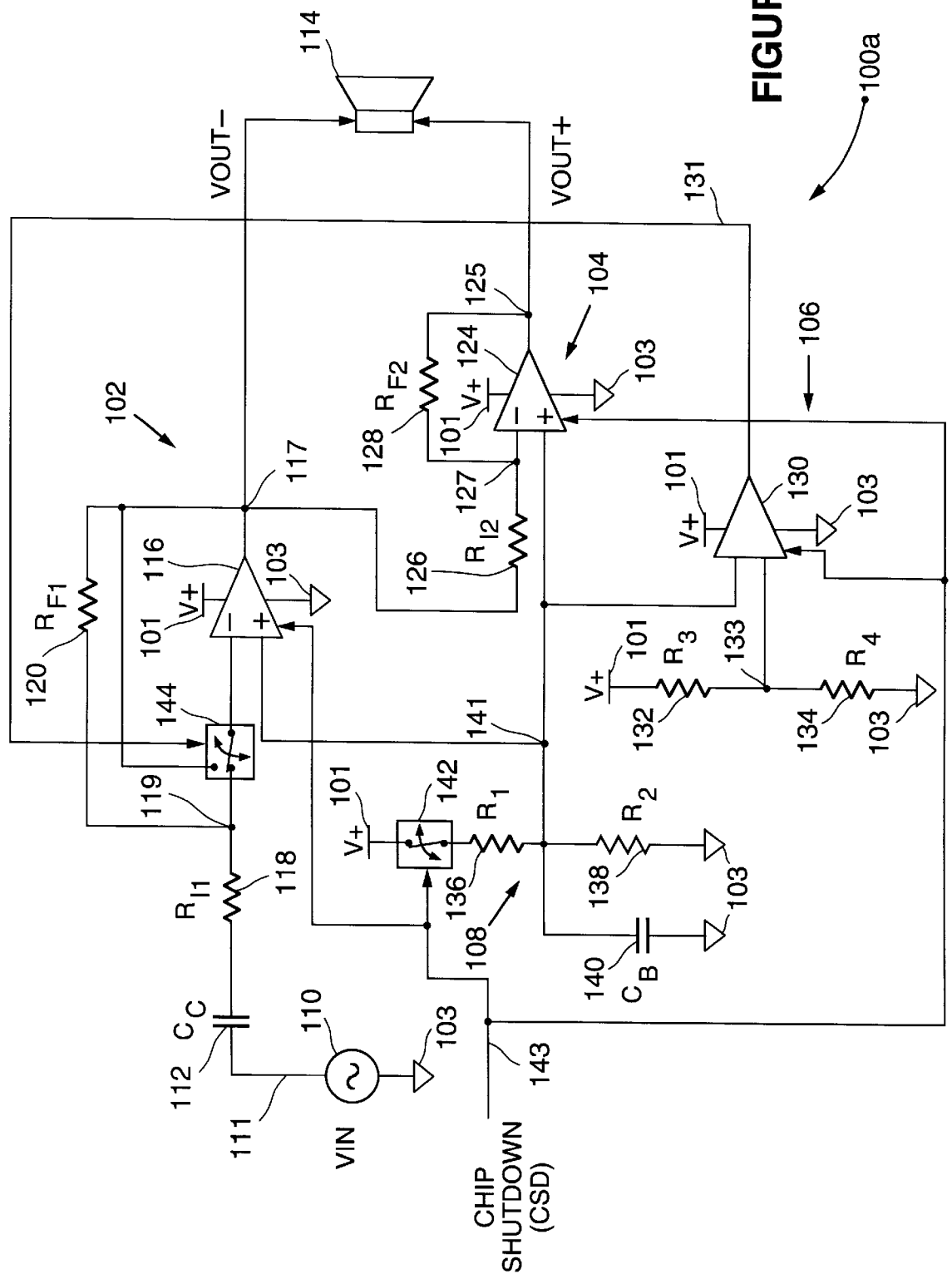
FIG. 3 is a schematic diagram of an analog amplifier circuit including features in accordance with another embodiment of the present invention.

Referring to FIG. 3, an amplifier circuit 100a including features in accordance with another embodiment of the present invention includes those elements as described above for FIG. 2, with the exception that single-pole, single-throw ("SPST") feedback switch 122 has been replaced by single-pole, double-throw ("SPDT") feedback switch 144. Operation of this circuit 100a corresponds to that of the circuit 100 of FIG. 2 as described above, with the "input" state (resistors $R_{I1}$, and $R_{F1}$ connected together at the inverting input of Op-Amp 116) and "feedback" state (output and inverting input of Op-Amp 116 connected together) of feedback switch 144 corresponding to the above-described "open" and "closed" states of feedback switch 122, respectively. (In this circuit 100a the input $R_{I1}$ and feedback $R_{F1}$ resistors both affect the RC time constant for charging the input coupling capacitor $C_C$, whereas in the circuit 100 of FIG. 2 the feedback resistor $R_{F1}$ plays no role.)

Figure 4:
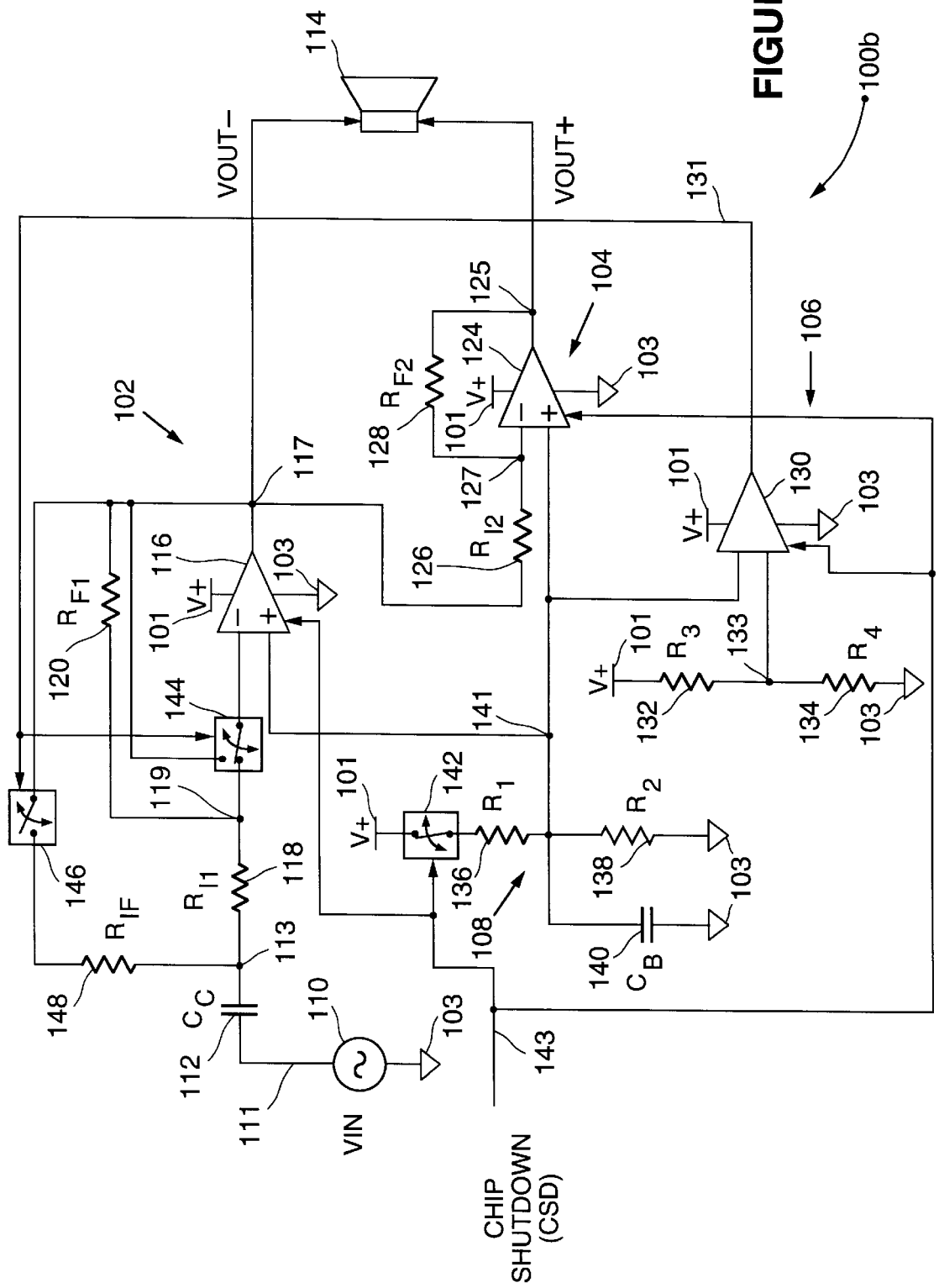
FIG. 4 is a schematic diagram of an analog amplifier circuit including features in accordance with still another embodiment of the present invention.

Referring to FIG. 4, an amplifier circuit 100b including features in accordance with still another embodiment of the present invention includes those elements as described above for FIG. 3, with the addition of another SPST feedback switch 146 and an input-feedback resistor $R_{IF}$ 148. Operation of this circuit 100b corresponds to that of the circuit 100a of FIG. 3 as described above, with the open and closed states of feedback switch 146 coinciding with the input and feedback states of feedback switch 144, respectively. (In this circuit 100b the resistance of the input-feedback resistor $R_{IF}$ is significantly less than the total resistance of the input $R_{I1}$ and feedback $R_{F1}$ resistors ($0 \leq R_{IF} << R_{I1} + R_{F1}$). Therefore, the RC time constant for charging the input coupling capacitor Cc is affected primarily by the input-feedback resistor $R_{IF}$ with virtually no effect from the input $R_{I1}$ and feedback $R_{F1}$ resistors.

In should be understood that each of the above-discussed switches 142, 144, 146 can be realized in a number of different ways. For example, simple electromechanical relays can be used. Alternatively, solid state switches in the form of transistors can be used. For example, metal oxide semiconductor field effect transistors (MOSFETs) can be used in the form of pass gates or transmission gates (both of which are well known in the art) with the control signal 131 accordingly being a single-ended or differential signal, respectively. Further, the switch control signal 131 can simply be binary, e.g. with high and low voltage values, or, alternatively, a "trapezoidally-shaped" signal with slower, predetermined rise and fall times so as to cause the switches 142, 144, 146 to turn on and off in a slower, more controlled manner. This latter type of signal can be particularly advantageous when the switches 142, 144, 146 are solid state and it is desirable for the switches 142, 144, 146 to have a finite serial impedance associated therewith when transitioning between their full-on and full-off states.

Figure 5:
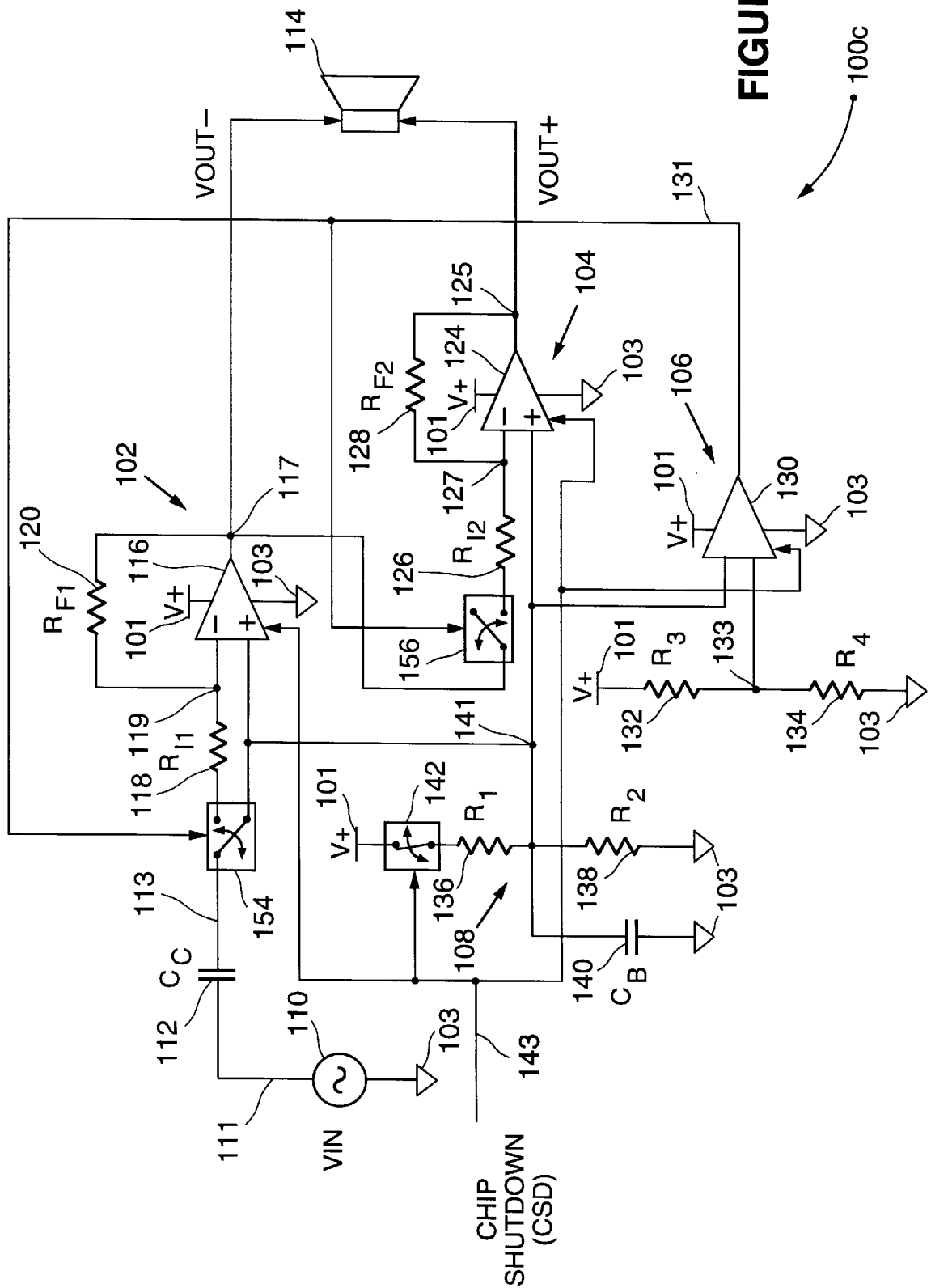
FIG. 5 is a schematic diagram of an analog amplifier circuit including features in accordance with yet another embodiment of the present invention.

Referring to FIG. 5, an amplifier circuit 100c including features in accordance with yet another embodiment of the present invention includes a first amplifier 102, a second amplifier 104, a controller 106 and a reference generator 108. As discussed in more detail below, the amplifiers 102, 104 have controllable modes of operation which are controlled by the controller 106. Based upon the values of two reference voltages provided by the reference generator 108, the controller 106 determines the mode of operation of each of the amplifiers 102, 104. The amplifier circuit 100c is driven by an AC signal source 110 through a coupling capacitor 112 and drives a load 114, e.g. a speaker. The first amplifier 102 provides an output signal VOUT− which drives the input to the second amplifier 104 and the load 114. The second amplifier 104 is an inverting amplifier with a gain of unity and provides an output signal VOUT+ which is substantially equal in magnitude and inverse in phase to the first output signal VOUT−. These two output signals VOUT−, VOUT+ form the "positive" and "negative" phases of a differential output signal provided to the load 114. It should be understood, however, that in accordance with the following discussion and the present invention, the load 114 can, alternatively, be a grounded load (e.g. an ac-grounded load, or a dc-grounded load which is capacitively coupled to the amplifier output) which is driven by only the output signal VOUT− from the first amplifier 102. (Although the following discussion is in terms of an inverting amplifier, it should be understood that the principles of the present invention are equally applicable to a noninverting amplifier as well.)

The first amplifier 102 includes an operational amplifier (Op-Amp) 116, an input resistor 118, a feedback resistor 120 and an input switch 154 (discussed in more detail below), connected substantially as shown. Similarly, the second amplifier 104 includes an Op-Amp 124, an input resistor 126, a feedback resistor 128 and an input switch 156 (discussed in more detail below), connected substantially as shown. In accordance with well known Op-Amp principles, the two amplifiers 102, 104 are inverting amplifiers with their respective voltage gains determined by the ratios of their feedback resistors to their input resistors. As noted above, the second amplifier 104 has a gain of unity. Therefore, its input 126 and feedback 128 resistors have equal values ($R_{I2}=R_{F2}$). The input 118 and feedback 120 resistors for the first amplifier 102 can be selected to provide the desired signal gain for the amplifier circuit. The controller 106 includes a voltage comparator 130. The reference generator 108 includes a first resistive voltage divider consisting of serially connected resistors 136, 138, a switch 142 and a bypass capacitor 140, plus a second resistive voltage divider consisting of two serially connected resistors 132, 134, all connected substantially as shown.

During initial turn-on of the amplifier circuit 100c, the switch 142 is closed (per the control signal 143) and the power supply 101 voltage V+ is applied to the Op-Amps 116, 124, comparator 130 and reference resistors 136, 138, 132, 134. (The control signal 143 is a chip shutdown signal which is used, as shown, to control the turn-on and tun-off of the Op-Amps 116, 124, as well as the comparator 130, e.g. in accordance with the technique disclosed in copending, commonly assigned U.S. patent application Ser. No. 08/168, 448, entitled "Click/Pop Free Bias Circuit" and filed on Dec. 17, 1993, the disclosure of which is hereby incorporated by reference.) Accordingly, the primary reference voltage 141 across the bypass capacitor 140 is initially zero due to the initially discharged state of the bypass capacitor 140 and begins to charge toward its charged value based upon the ratio of the lower resistor 138 to the sum of the resistors 136, 138. Meanwhile, however, the secondary reference voltage 133 is at its full value immediately, as determined by the ratio of the lower resistor 134 to the sum of the resistors 132, 134. (As discussed in more detail below, the secondary reference voltage 133 is typically selected to be slightly less than the fully charged value of the primary reference voltage 141 so as to introduce some hysteresis into the thresholding action of the comparator 130.) The comparator 130 compares these two reference voltages 141, 133 and provides an output control signal 131 to the switches 154, 156 based upon such comparison.

Initially, as long as the primary reference voltage 141 is less than the secondary reference voltage 133, the control signal 131 causes the switches 154, 156 to operate in their respective first states as shown in FIG. 5. With the first input switch 154 in its first state, one terminal of the input coupling capacitor 112 is connected to the non-inverting input of the first Op-Amp 116, thereby resulting in the coupling 112 and bypass 140 capacitors being effectively connected in parallel (with the other terminal of the input coupling capacitor 112 connected to circuit ground 103 through the output impedance of the input signal source 110). This causes the coupling 112 and bypass 140 capacitors to be charged together by the primary reference voltage 141 through resistor 136 and the first amplifier 102 to function as a voltage follower with respect to its non-inverting input which receives the primary reference voltage 141. Therefore, the output voltage 117 of the first Op-Amp 116 is equal to its input voltage, i.e. the primary reference voltage 141.

With the second input switch 156 in its first state, such switch 156 is in its open, or high impedance, state, thereby interrupting the connection between the output of the first Op-Amp 116 and the input resistor 126 of the second Op-Amp 124. This causes the second amplifier 104 to also function as a voltage follower with respect to its non-inverting input which also receives the primary reference voltage 141. Therefore, the output voltage 125 of the second Op-Amp 124 is equal to its input voltage, i.e. the primary reference voltage 141. Accordingly, the two output signals VOUT−, VOUT+ to the load 114 are equal, thereby resulting in a net zero differential signal to the load 114.

Alternatively, the second input switch 156 can be omitted since the gain of the second amplifier 104 is selected such that VOUT+ will be equal in magnitude and opposite in phase to VOUT−, thereby producing a net zero voltage across the load 114 anyway.

Eventually, the primary reference voltage 141 charges up to and surpasses the secondary reference voltage 133. The comparator 130 senses this and adjusts its output control signal 131 accordingly. When the primary reference voltage 141 exceeds the secondary reference voltage 133 the comparator control signal 131 causes the switches 154, 156 to operate in their respective second states. With the first input switch 154 in its second state, the terminal of the input coupling capacitor 112 previously connected to the non-inverting input of the first Op-Amp 116 is now connected to the input resistor 118 of the first Op-Amp 116. With the second input switch 156 in its second state, such switch 156 is in its closed, e.g. shorted, state, thereby providing the output signal 117 of the first amplifier 102 as the input signal to the second amplifier 104. The amplifier circuit 100c is then configured for its normal, steady-state AC signal operation. The two amplifiers 102, 104 operate as two serially cascaded, inverting amplifiers which receive the single-ended AC-coupled input signal 113 and amplify it to provide to the load 114 a differential signal formed by two output signals VOUT−, VOUT+ which are equal in magnitude and inverse in phase.

As should be understood from the foregoing discussion, with a virtually net zero differential signal applied across the load 114, virtually no turn-on transients are presented to the load 114. Similarly, it should be understood that where the load 114 is a grounded load and a single-ended output signal (i.e. either VOUT− or VOUT+) is applied thereto, virtually no turn-on transients occur. During turn-on, the output signal equals the primary reference voltage 141 which is initially zero and then subsequently a slowly charging DC voltage.

Figure 5A:
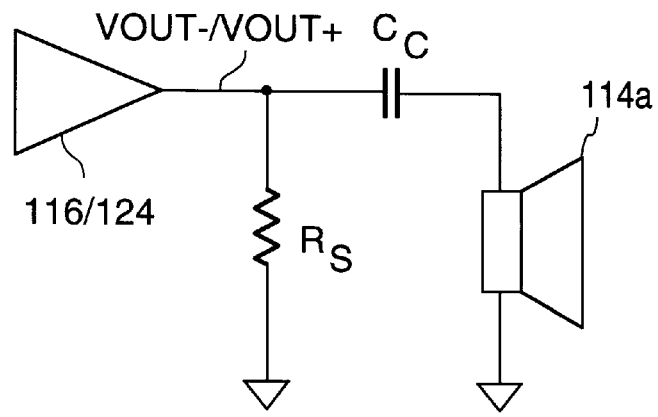
FIG. 5A is a schematic diagram of a single-ended load circuit for use with an analog amplifier circuit in accordance with the present invention.

Referring to FIG. 5A, in those cases where a single-ended load circuit is used, i.e., where a grounded load 114a is driven by the output signal VOUT− (or VOUT+) from one of the amplifiers 116 (or 124) of the amplifier circuit 100/100a/100b/100c (FIGS. 2, 3, 4 and 5), such output signal VOUT−/VOUT+ is coupled to the load 114a via a coupling capacitor $C_C$ and is applied across a shunting resistor $R_S$. Accordingly, when the output signal VOUT−/VOUT+ is removed (e.g., when the amplifier 116/124 is turned off), any charge remaining on the coupling capacitor $C_C$ is discharged through the load 114a and shunting resistor $R_S$.

Common to the active portions of each of the amplifier circuits 100/100a/100b/100c (FIGS. 2, 3, 4 and 5), including the individual amplifiers 116, 124, is a chip shutdown (CSD) control signal which is asserted following a "turn off" mode of operation to shut down those circuits and/or devices which draw supply current during normal operation. This allows the power supply current drain to be cut to virtually zero without requiring the power supply itself to be turned off or disconnected. (Techniques for accomplishing such a shut down are many and well known in the art.)

It should be understood that each of the above-discussed switches 142, 144, 146, 154, 156 can be realized in a number of different ways. For example, simple electromechanical relays can be used. Alternatively, solid state switches in the form of transistors can be used. For example, metal oxide semiconductor field effect transistors (MOSFETs) can be used in the form of pass gates or transmission gates (both of which are well known in the art) with the control signal 131 accordingly being a single-ended or differential signal, respectively. Further, the switch control signal 131 can simply be binary, e.g. with high and low voltage values, or, alternatively, a "trapezoidally-shaped" signal with slower, predetermined rise and fall times so as to cause the switches 142, 144, 146, 154, 156 to turn on and off in a slower, more controlled manner. This latter type of signal can be particularly advantageous when the switches 142, 144, 146, 154, 156 are solid state and it is desirable for the switches 142, 144, 146, 154, 156 to have a finite serial impedance associated therewith when transitioning between their full-on and full-off states.

Figure 6:
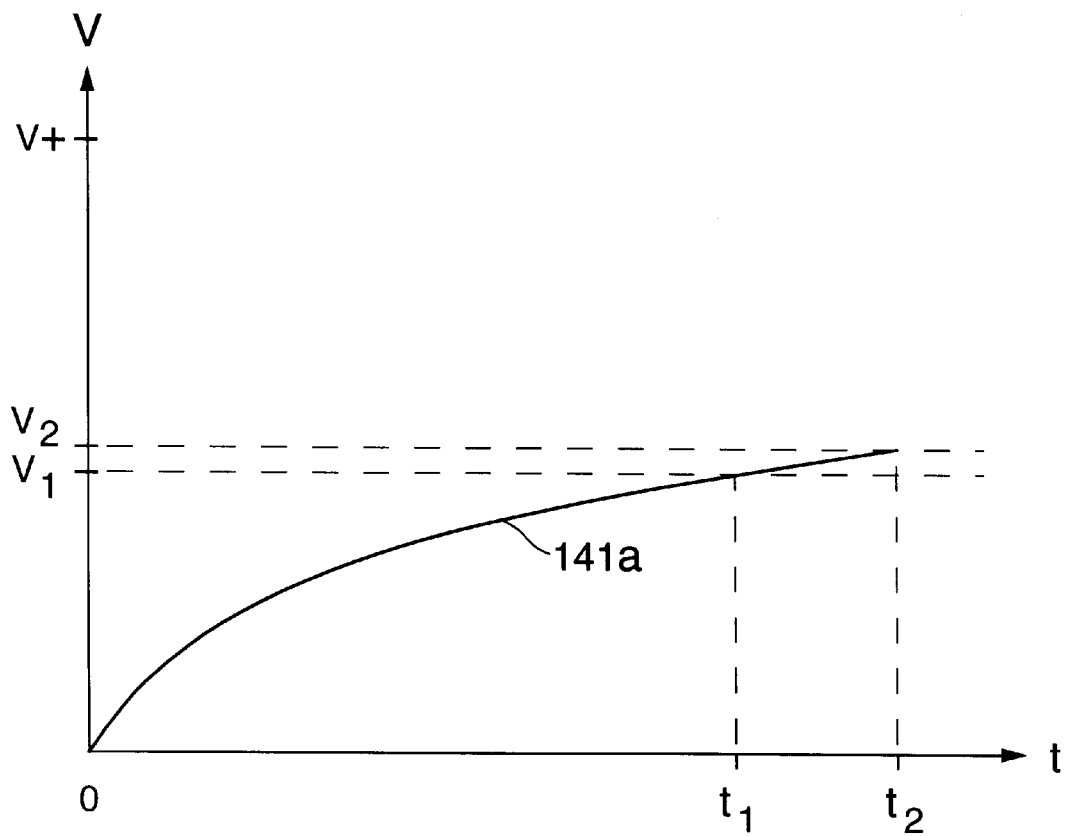
FIG. 6 is a voltage-versus-time diagram for the charging of the primary reference voltage for the circuits of FIGS. 2–5.

Referring to FIG. 6, the above-discussed difference between the primary 141 and secondary 133 reference voltages can be better understood. As discussed above, during turn-on, the primary reference voltage 141a charges from an initial value of zero to a final value of $V_2$ which is determined by the ratio of its resistors 136, 138. At a point $t_1$ in time, the primary reference voltage 141a equals the secondary reference voltage 133 which has a value of $V_1$ as determined by the ratio of its resistors 132, 134. Ultimately, at a subsequent point $t_2$ in time, the primary reference voltage 141a reaches its final value $V_2$. During the initial time interval between "time 0" (initial turn-on) and time $t_1$, feedback switch 122 (FIG. 2) is in its closed state, feedback switch 144 (FIGS. 3 and 4) is in its feedback state, feedback switch 146 (FIG. 4) is in its closed state and input switches 154, 156 (FIG. 5) are in their first states, and subsequently, after time $t_1$, feedback switch 122 is switched to its open state, feedback switch 144 is switched to its input state, feedback switch 146 is switched to its open state and input switches 154, 156 are switched to their second states, as discussed above.

Alternatively, one or both of the values $R_1$, $R_2$ of the voltage divider resistors 136, 138 can be made to be variable in such a way as to make their ratio selectable. For example, another resistor with a switch (not shown) can be connected across the upper resistor 136 for switching in and then out of a parallel connection with such resistor 136, thereby causing the primary reference voltage 141a to initially charge toward a higher voltage value $V_2$. At point $t_1$ in time when the primary reference voltage 141a equals the secondary reference voltage 133, the control signal 131 can be used to open the switch and cause the primary reference voltage 141a to cease charging and remain at some fixed value above the threshold voltage $V_1$ as determined by the ratio of the voltage divider resistors 136, 138 (i.e. without the added resistor in parallel with the upper resistor 136).

As should be understood from the foregoing, an amplifier circuit including features in accordance with the present invention can have a controllable gain for reducing turn-on transients. During an initial time period, following initial turn-on of the circuit, the circuit gain is controlled in such a manner as to cause the output to follow its slowly rising DC reference voltage. Once such a DC reference voltage reaches a predetermined value, the gain of the circuit is reestablished for normal, steady-state signal operation.

Alternatively, and as should also be understood from the foregoing, an amplifier circuit including features in accordance with the present invention can have controllable modes of operation for reducing turn-on transients. During an initial time period, following initial turn-on of the circuit, the circuit gain is controlled in such a manner as to cause the output to follow its slowly rising DC reference voltage. Once such DC reference voltage reaches a predetermined value, the gain of the circuit is re-established for normal, steady-state signal operation.

Figure 7:
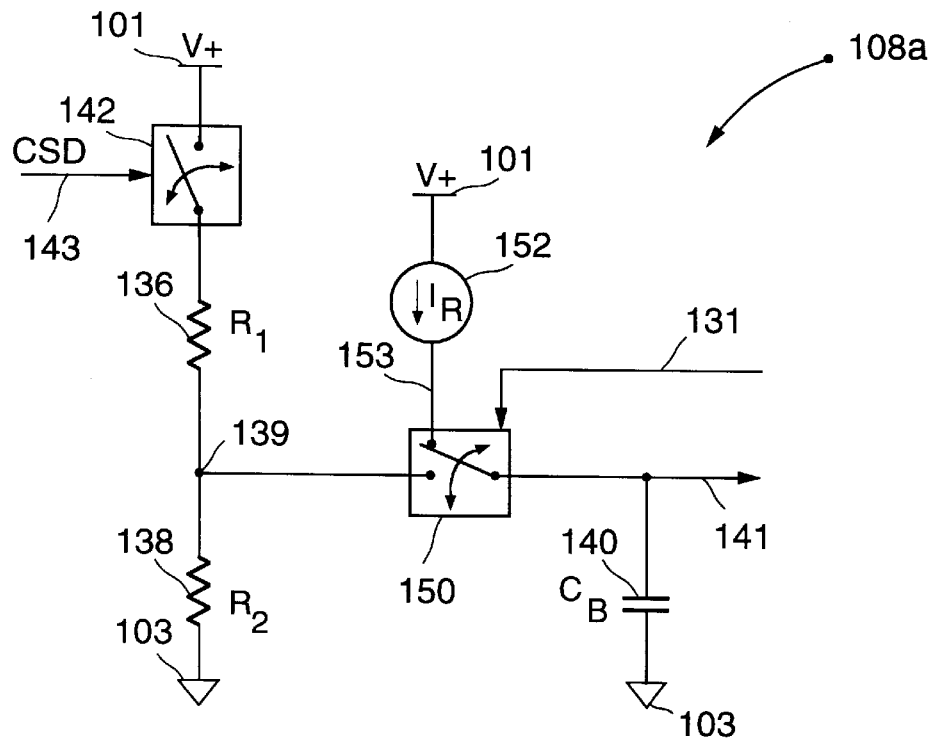
FIG. 7 is a schematic diagram of an improved reference generator for use in an analog amplifier circuit including features in accordance with yet still another embodiment of the present invention.
Figure 8:
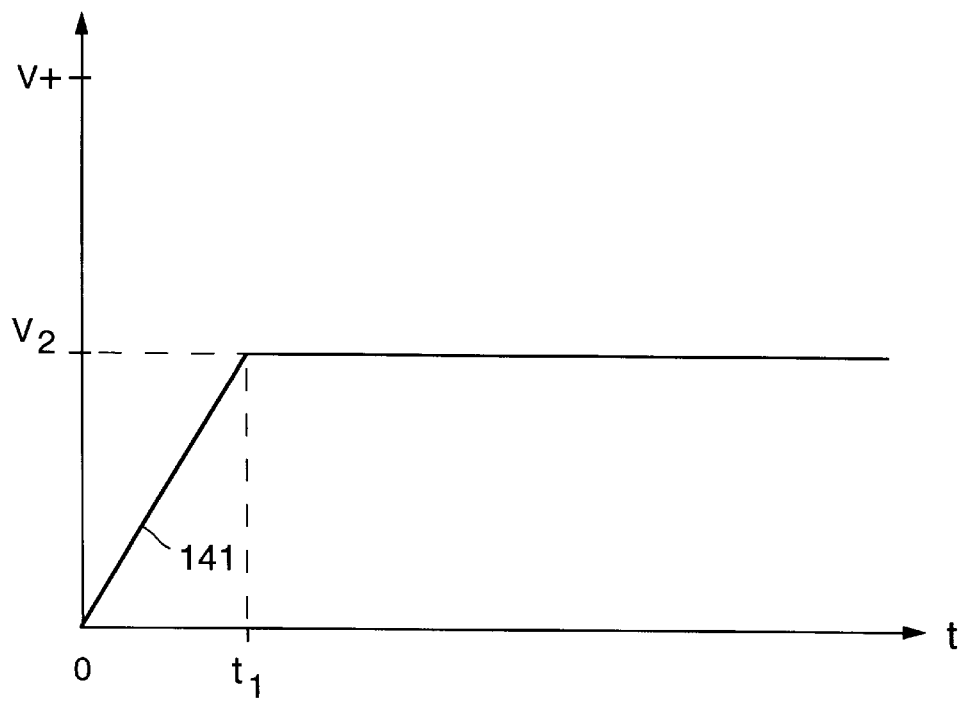
FIG. 8 is a voltage-versus-time diagram for the charging of the primary reference voltage with the improved reference generator of FIG. 7.

Referring to FIG. 7, an improved reference generator 108a for use in an analog amplifier circuit (e.g. the analog amplifier circuits 100, 100a, 100b, 100c of FIGS. 2–5) including features in accordance with yet still another embodiment of the present invention includes a SPDT switch 150 and constant current source 152 interconnected as shown with the above-discussed resistors 136, 138 and bypass capacitor 140. The switch 150 is preferably controlled by the above-discussed control signal 131. During application of DC power V+ and de-assertion of a control signal SD (not shown; discussed in more detail below), and when the control signal 131 indicates that the previously discharged reference voltage 141 has not yet charged to the desired value, the control signal 131 causes the switch 150 to be in its first state whereby the constant current source 152 charges the bypass capacitor 140 with a constant current $I_R$ 153. This causes the reference voltage 141 to charge in a linear manner toward its desired value (see FIG. 8). Once the reference voltage 141 has reached its desired value, i.e., after it has surpassed the secondary reference voltage 133 (FIGS. 2–5), the control signal 131 changes state and causes the switch 150 to switch to its second state whereby the voltage 139 across resistor $R_2$, which is also equal to the desired value, is applied across the bypass capacitor 140 to maintain its charge state.

A significant advantage provided by this reference generator 108a is that, for a given set of values $R_1$, $R_2$ for the voltage divider resistors 136, 138, control over any "pop" or "click" presented to the load is no longer dependent upon only the value of the bypass capacitor 140, but is also now dependent upon the current 153 provided by the current source 152 for charging the capacitor 140. Furthermore, with the bypass capacitor 140 charged in a linear manner, the threshold at which circuit turn-on is deemed effective can be more precisely controlled. By selecting an appropriate value of charging current 153 a lower valued bypass capacitor 140 can be used to achieve the desired reduction in DC power related transients across the load. For example, the charging current 153 can be set at a relatively large value so that the start-up time is reduced as compared to the start-up time resulting from the use of a reference generator 108 with resistive charging (FIGS. 2–5). This can be advantageous in applications where a faster turn-on is desired but low-value resistors to generate the half-supply reference voltage 139 cannot be tolerated. While the resulting DC power related transients would still be relatively large in such cases, they would nonetheless be smaller than those resulting from the use of resistive charging at the same charge rate.

Another significant advantage provided by this reference generator 108a is that the use of this improved reference generator 108a results in more easily predictable and controllable charging waveforms throughout the amplifier circuit. Using a constant current source to charge the bypass capacitor causes the charging waveforms to follow lower order differential equations. Accordingly, the peak values of any DC power related transients are more easily predicted and the relationships of the various controllable variables involved in producing such waveforms are also simpler to understand and predict.

Figure 1:
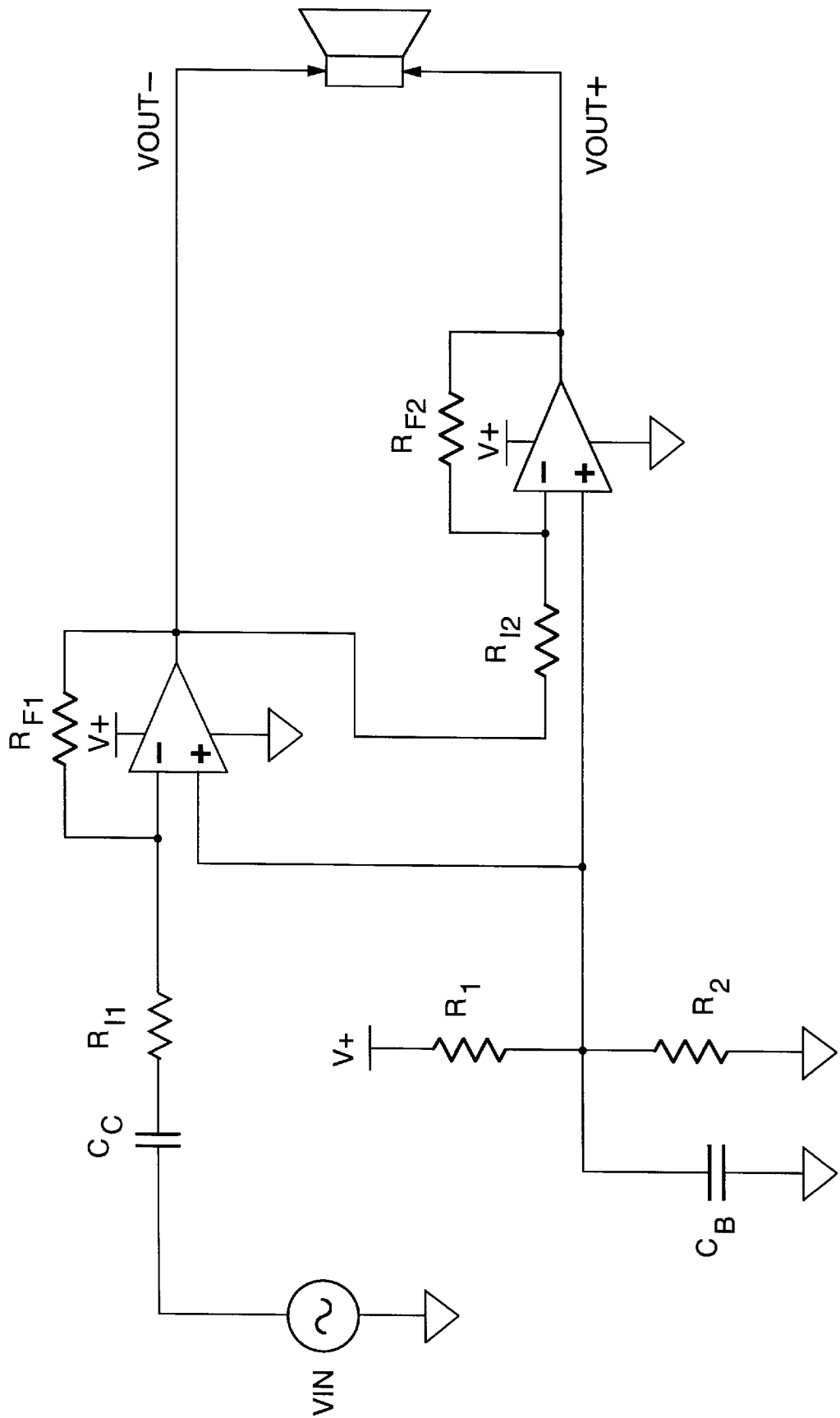
FIG. 1 is a schematic diagram of a conventional analog amplifier circuit for amplifying audio signals in a bridge-tied-load ("BTL") configuration.

Using conventional circuit analysis techniques (e.g., Kirchoff's voltage and current laws and Thevenin's and Norton's theorems), it can be shown that, for a given start-up time, DC power related transients are reduced to approximately one-half of those which would otherwise result. For example, using the conventional amplifier circuit of FIG. 1, with $R_1=48$ Kohms, $R_2=50$ Kohms, $R_{f1}=20$ Kohms, $R_{F1}=20$ Kohms, $C_C=0.4$ $\mu$F, $R_{LOAD}=8$ ohms, $C_{LOAD}=1000$ $\mu$F and V+=5 volts (where $R_{LOAD}$ and $C_{LOAD}$ are the values of the resistance and capacitance of the load 114), the circuit turn-on time is approximately 1 second and the transient across the load is approximately 74 millivolts. However, using the same circuit except for the substitution of the improved reference generator 108a, with $C_B=0.1$ $\mu$F and $I_R=0.27$ $\mu$A, the peak voltage transient appearing across the load is approximately 35 millivolts.

Figure 9:
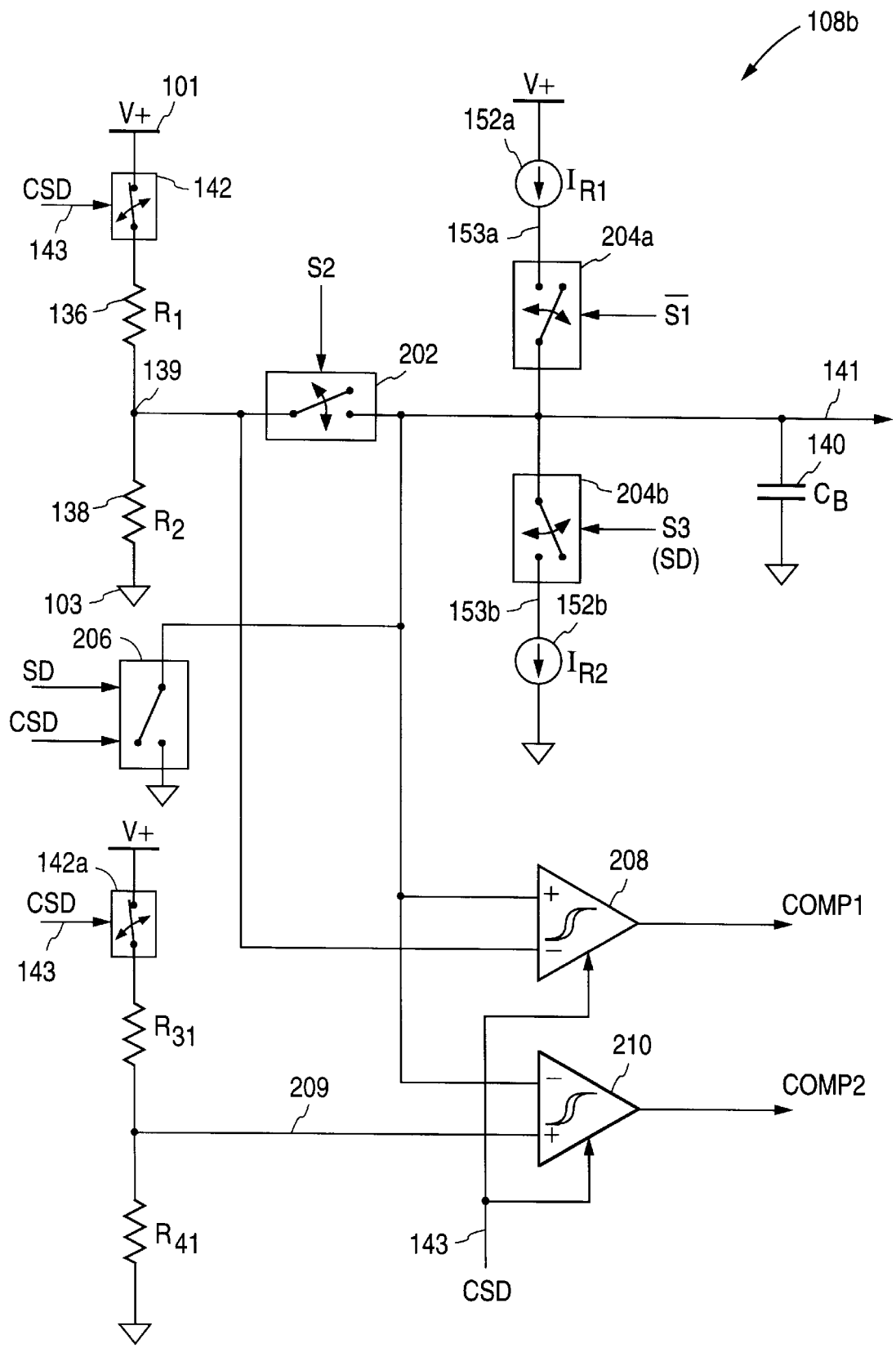
FIG. 9 is a functional block and schematic diagram of an improved reference generator for use in an analog amplifier circuit in accordance with an additional embodiment of the present invention.

Referring to FIG. 9, a further improved reference generator 108b for use in an analog amplifier circuit (e.g. the analog amplifier circuits 100, 100a, 10b, 100c of FIGS. 2–5) in accordance with an additional embodiment of the present invention includes the above-discussed resistors 136, 138 and bypass capacitor 140, plus a charging current source 152a, a discharging current source 152b, two voltage comparators, 208, 210 (with hysteresis) and four switching circuits, 202, 204a, 204b, 206 which, as discussed in more detail below, control the charging and discharging of the reference voltage 141. The switching circuits 202, 204a, 204b, 206 are controlled by a number of control signals S1, S2, S3, SD, CSD (discussed in more detail below). Control signal SD is an externally asserted shutdown signal and is used to initiate a "turn off" mode. Control signal CSD is a chip shutdown signal which, when asserted, shuts down most if not all current drawing circuits in the system.

As discussed above for the circuit of FIG. 7, the charging current source 152a, via its control switch 204a, charges the bypass capacitor 140 to produce the reference voltage 141. The discharging current source 152b, via its control switch 204b, discharges the bypass capacitor 140. This discharging of the bypass capacitor 140 with a constant current source 152b causes the reference voltage 141 to discharge from its nominal operating voltage level toward circuit ground potential in a linear manner.

The first voltage comparator 208, when its associated switch 202 is opened, compares the reference voltage 141 to the voltage 139 across resistor $R_2$ and produces an output signal COMP1 which is asserted at a high state and de-asserted at a low state when the reference voltage 141 is higher and lower, respectively, than the voltage 139 across resistor $R_2$. Similarly, the second voltage comparator 210 compares the reference voltage 141 to a voltage 209 produced by another voltage divider circuit. It produces an output signal COMP2 which is de-asserted at a low state and asserted at a high state when the voltage divider voltage 209 is higher and lower, respectively, than the reference voltage 141. The voltage divider voltage 209 is a very low voltage, e.g., 2.5 percent of the V+ voltage.

The last switching circuit 206 operates as a power-down discharge circuit for ensuring that the bypass capacitor 140 becomes fully discharged during a power-down state of the system.

Figure 10:
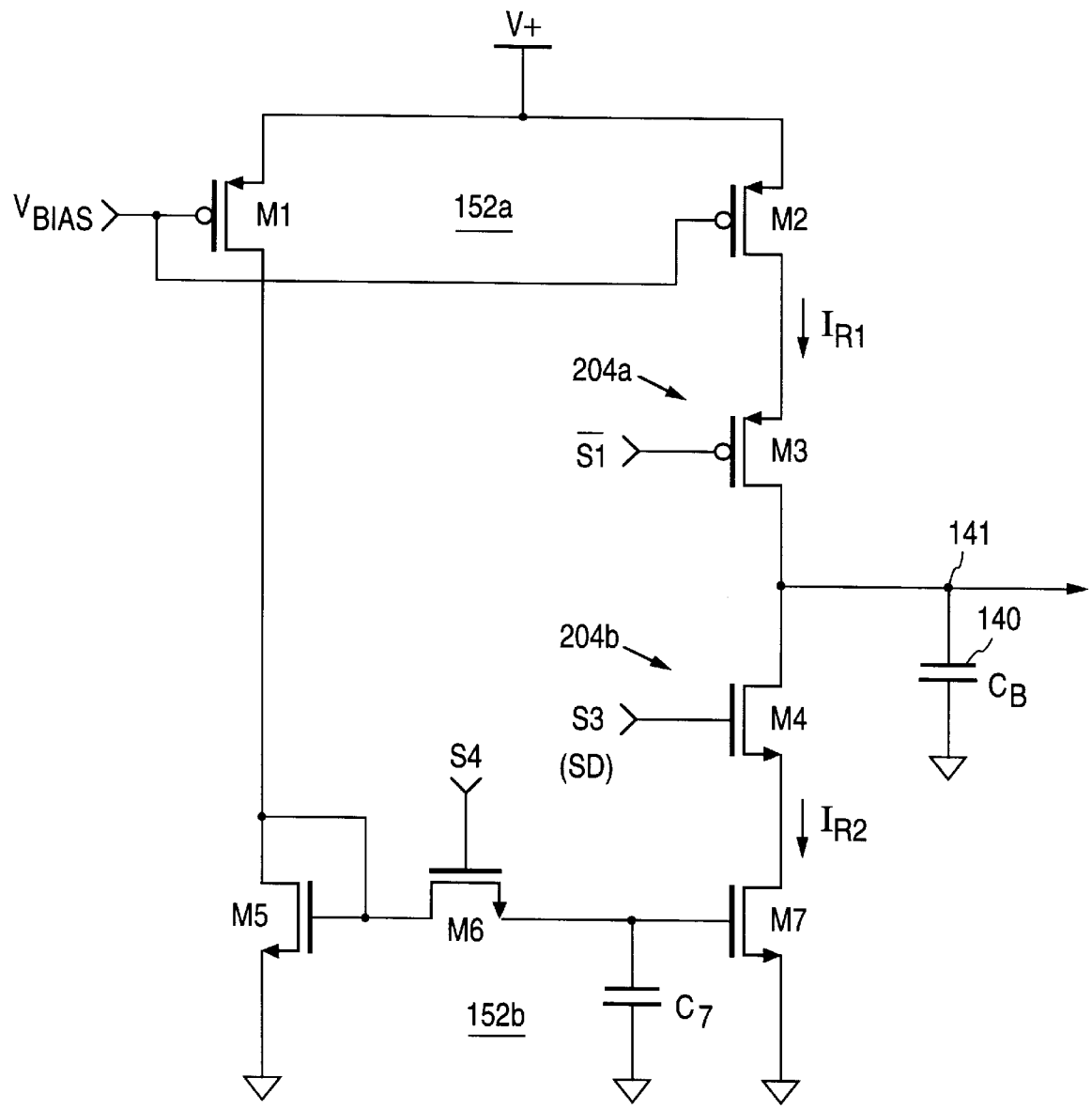
FIG. 10 is a schematic diagram of the current sources and associated switches in the circuit of FIG. 9.

Referring to FIG. 10, the charging current source 152a and associated switching circuit 204a and the discharging current source 152b and associated switching circuit 204b can be implemented as shown. The charging current source 152a is a current mirror circuit implemented with P-type metal oxide semiconductor field effect transistors (MOSFETs) M1 and M2. The switching circuit 204a is implemented with P-type MOSFET M3. The discharging current source 152b is implemented with N-type MOSFETs M5, M6 and M7 and a bypass capacitor $C_7$, The switching circuit 204b is N-type MOSFET M4.

Assertion of control signal $\overline{S1}$ at a logic low state causes the bypass capacitor 140 to charge with the charging reference current $I_{R1}$. Assertion of control signal S3 (SD) at a logic high state causes the bypass capacitor 140 to discharge by sinking the discharge reference current $I_{R2}$ to circuit ground. Maintaining control signal S4 at a logic high state causes a voltage to be maintained across capacitor $C_7$. During de-assertion of control signal S4, the charge stored in capacitor $C_7$ maintains the gate bias on transistor M7, thereby ensuring that transistor M7 stays on to sink the discharge current $I_{R2}$ from the bypass capacitor 140 even after the system has entered the chip shutdown mode of operation.

Figure 11:
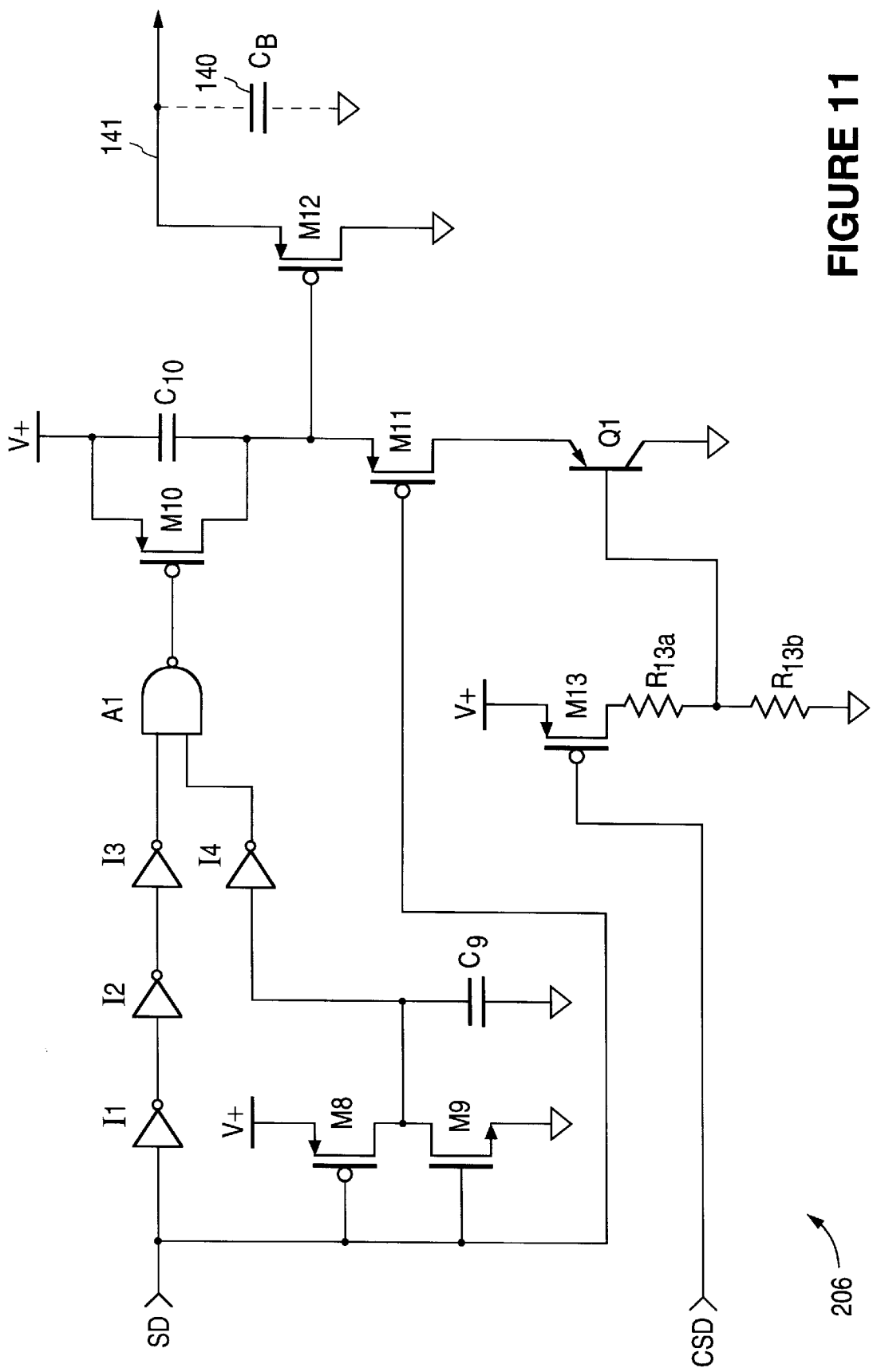
FIG. 11 is a schematic diagram of the discharge switch circuit in the circuit of FIG. 9.

Referring to FIG. 11, the power-down discharge switching circuit 206 can be implemented with MOSFETs M8, M9, M10, M11, M12, M13, a PNP bipolar junction transistor Q1, inverters I1, I2, I3, I4, AND gate A1, resistors $R_{13a}$, $R_{13b}$ and capacitors $C_9$ and $C_{10}$, all interconnected substantially as shown. During a power-down condition, e.g., when the power supply is turned off and the power supply voltage V+ decreases to zero, transistor M12 provides a discharge path to circuit ground for the bypass capacitor 140, thereby allowing it to discharge completely during power-down. As the power supply voltage V+ decreases to zero, capacitor $C_{10}$ will maintain some amount of charge, thereby pulling the gate of transistor M12 below circuit ground potential. Accordingly, transistor M12 turns on, thereby ensuring a full discharge of the bypass capacitor 140.

The resistive voltage divider $R_{13a}$, $R_{13b}$ establishes a reference voltage at the base of transistor Q1. The gate of transistor M12 will be approximately one diode voltage drop above such reference voltage. The value of these resistors $R_{13a}$, $R_{13b}$ are selected to ensure that the gate of transistor M12 is at least one MOSFET threshold voltage drop below the power supply potential V+ during normal operation so that transistor M12 will turn on as the power supply potential V+ goes to zero. Additionally, the voltage at the gate of transistor M12 must be sufficiently high so that transistor M12 does not turn on during normal operation.

Transistors M8, M9, capacitor $C_9$, inverters I1, I2, I3 and I4, AND gate A1 and transistor M10 ensure that capacitor $C_{10}$ is discharged each time the circuit 206 comes out of shutdown. When the shutdown control signal SD transitions from a logic high state to a logic low state, a brief logic low signal pulse is applied to the gate of transistor M10, thereby discharging capacitor $C_{10}$.

Figure 12:
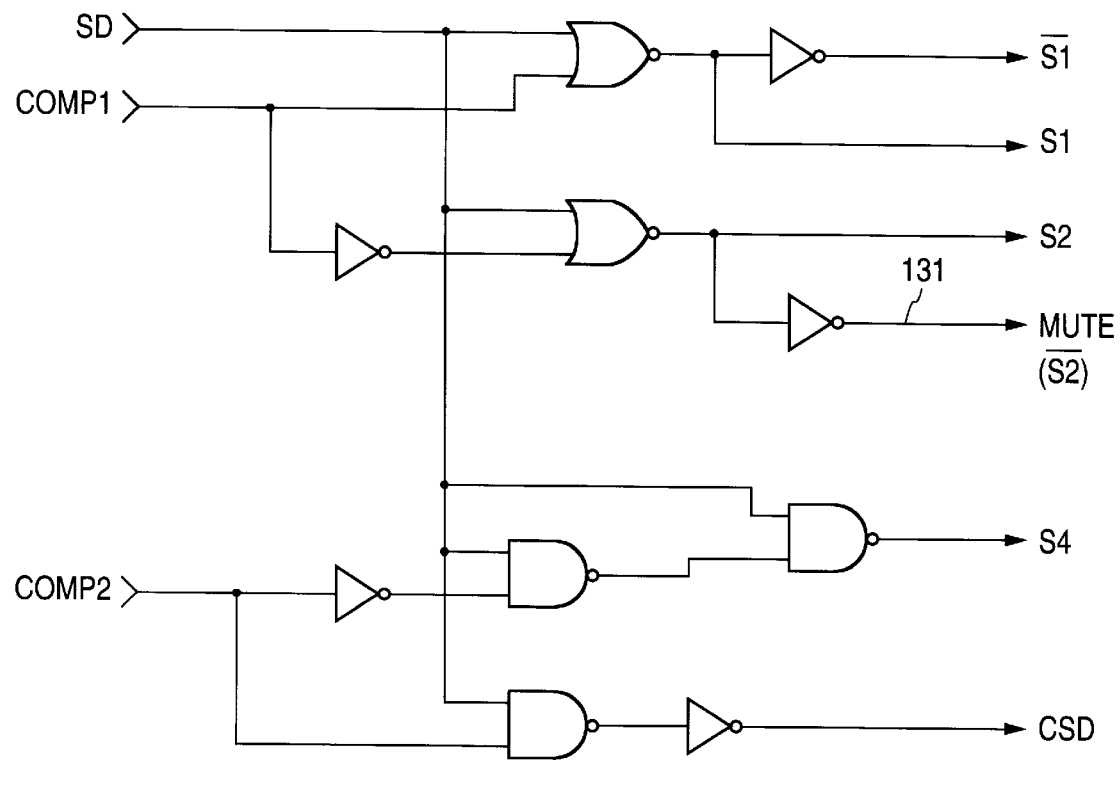
FIG. 12 is a logic diagram of the logic circuitry used to generate the control signals for the circuits of FIGS. 9, 10, and 11.

Referring to FIG. 12, a logic circuit 300 suitable for generating switch control signals S1, S2 and S4, as well as the chip shutdown control signal CSD and mute control signal 131, using the shutdown control signal SD and comparator output signals COMP1, COMP2 can be implemented as shown.

Figure 13:
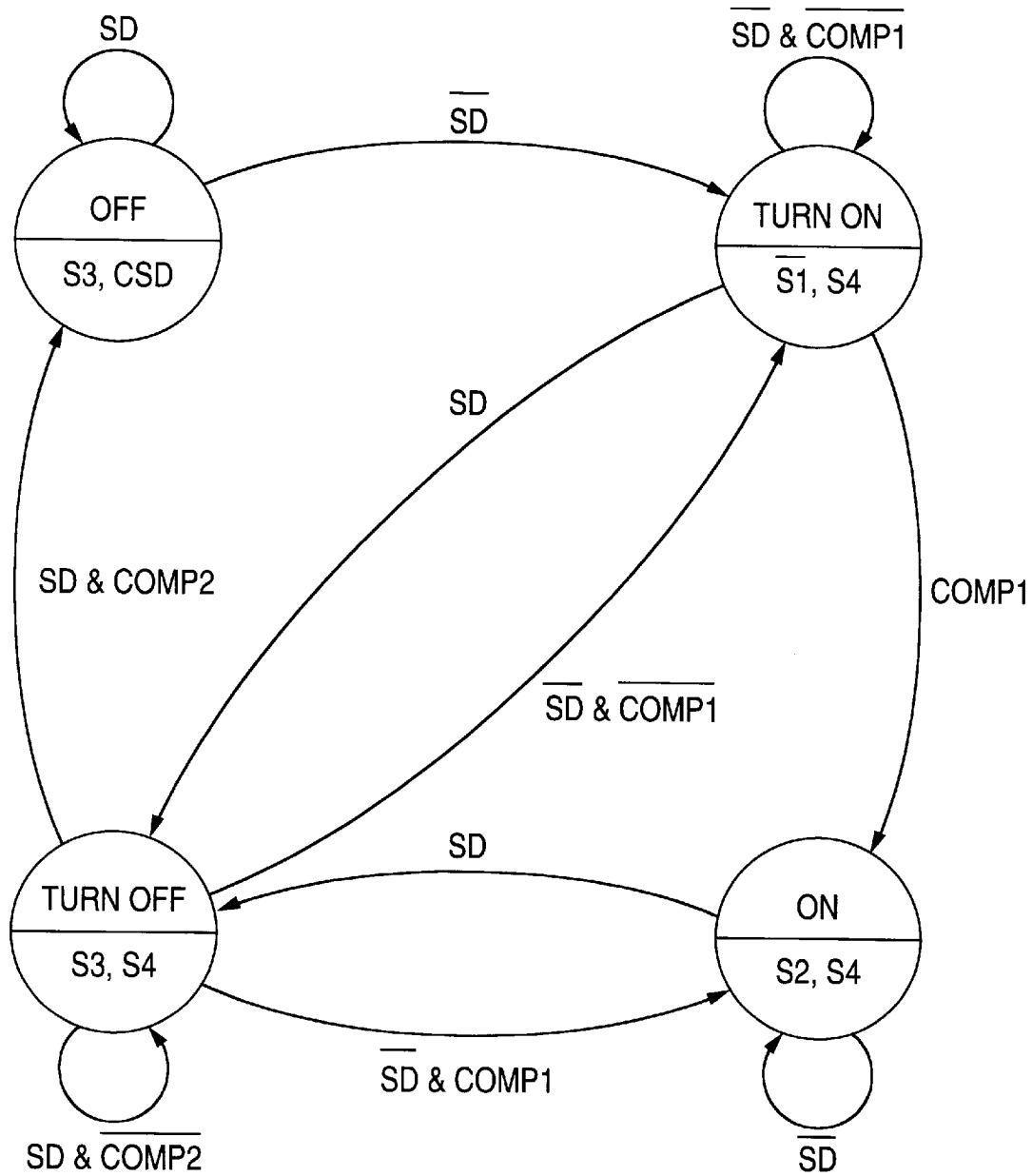
FIG. 13 is a state diagram for the circuits of FIGS. 9, 10, and 11.

Referring to FIG. 13, the state of the system using the reference generator 108b of FIG. 9 and its associated control signals during "off," "turn on," "on" and "turn off" states of operation can be represented as shown. For example, during an "off" mode of operation, control signals S3 and CSD are asserted, and remain so for as long as the shutdown control signal SD is asserted. Upon de-assertion of the shutdown control signal SD, a "turn on" mode of operation is begun. During this mode, control signal S1 is asserted at a low state and control signal S4 is asserted at a high state. This mode is maintained so long as the shutdown control signal SD and first comparator output signal COMP1 are both asserted at logic low states. Transitions to and from the remaining states of operation ("on" and "turn off") are initiated and such states of operation are maintained in accordance with the various control signals as shown.

Figure 14:
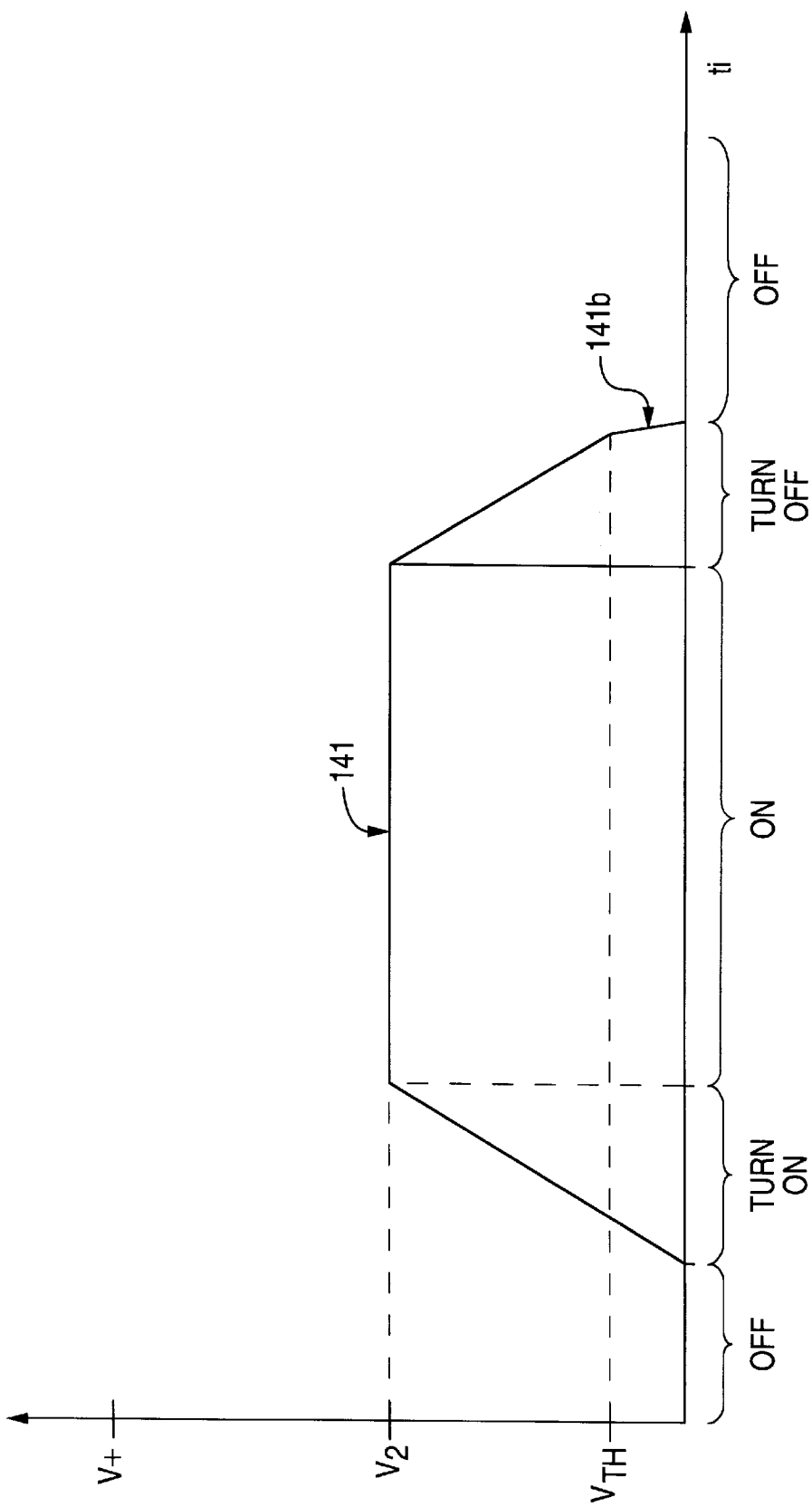
FIG. 14 is a voltage-versus-time diagram for the charging and discharging of the primary reference voltage with the improved reference generator of FIG. 9.

Referring to FIG. 14, the state of the reference voltage 141 can be represented as shown. During an "off" state, the reference voltage 141 is at circuit ground potential. During an "on" state of operation, the reference voltage 141 is at its final value $V_2$. In between, i.e., during "turn on" and "turn off" modes of operation, the reference voltage 141 is charging and discharging, respectively, between these levels in a linear manner. However, during the "turn off" mode of operation, the discharging reference voltage 141 is monitored by the second voltage comparator 210 (FIG. 9) which compares it to a threshold voltage $V_{TH}$ 209 (e.g., 2.5% of V+) and provides an output signal COMP2 which is driven to a high state when the reference voltage 141 drops below the threshold voltage $V_{TH}$ 209. (Upon transcending such threshold voltage $V_{TH}$ 209, the voltage 141 across the bypass capacitor 140 can be discharged at a different rate 141b which, as desired, can be made slower or faster and/or can be made non-linear by connecting a resistance across the bypass capacitor 140.) This signal COMP2, in turn via the logic circuit 300 (FIG. 12), is used to generate the chip shutdown control signal CSD which, as discussed above, shuts down the active circuits and/or devices within the amplifier circuits 100, 100a, 100b, 100c (FIGS. 2, 3, 4 and 5). This advantageously allows for a self-timed chip shutdown which is voltage-dependent rather than time-dependent. In other words, once the bypass capacitor 140 has been discharged to an acceptable level, chip shutdown is automatically initiated without the need for any form of active clock signal to determine the appropriate time for chip shutdown.

As represented, this logic circuit 300 generates these control signals in accordance with the following Boolean logic expressions:

$\overline{S1} = SD + COMP1$ $S2 = \overline{SD} \cdot COMP1$ $S3 = SD$ $S4 = \overline{SD} + SD \cdot \overline{COMP2}$ $CSD = SD \cdot COMP2$ $MUTE = \overline{S2}$ Based upon the foregoing, it should be understood that the above-discussed features of an amplifier circuit in accordance with the present invention can include various combinations of the above-discussed features. For example, the improved reference generators 108a, 108b can be used advantageously in the amplifier circuits 100, 100a, 100b, 100c of FIGS. 2–5. Also, an additional bypass switch can be used for shorting across input resistor $R_{f1}$, 118 in the amplifier circuits 100, 100a, 100b of FIGS. 2, 3 and 4 so as to cause the input coupling capacitor $C_C$ and bypass capacitor $C_B$ to be charged (linearly) simultaneously by the current $I_R$ from the current source 152. Alternatively, such bypassing of the input resistor $R_{f1}$ 118 in the circuit 100b of FIG. 4 can be achieved by making the input feedback resistor $R_{IF}$=0 ohms and by placing the switches 144, 146 in their appropriate states. Such bypassing is not necessary in the circuit 100c of FIG. 5 due to the action of the input switch 154.

The above-discussed amplifier circuits use two inverting amplifiers connected in series to generate the differential output signal for driving the load. However, it should be understood that other amplifier circuit configurations can be used in accordance with the principles of the present invention. For example, two amplifiers connected in parallel, one inverting and the other noninverting, can be used as well whereby the amplifiers share a common input signal and provide the two opposing phases of the differential output signal.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an amplifier circuit for operating with a selectively variable reference voltage for reducing turn-on and turn-off transients, said amplifier circuit comprising:
   a first amplifier configured to be biased between a power supply voltage and a circuit ground potential, to receive a reference voltage having a selectively variable magnitude and to receive a first input signal and in accordance therewith provide a first output signal with a magnitude which varies in relation to and is approximately equal to a sum of said reference voltage and a selected multiple of said first input signal; and
   a reference generator, coupled to said first amplifier, configured to provide said reference voltage, wherein
      during a turn-on time period, said reference voltage magnitude changes linearly from approximately said circuit ground potential toward a fixed reference voltage magnitude,
      during an on-time period subsequent to said turn-on time period, said reference voltage remains at said fixed reference voltage magnitude,
      during a turn-off time period subsequent to said on-time period, said reference voltage magnitude changes linearly from said fixed reference voltage magnitude toward said circuit ground potential, and
      during an off time period subsequent to said turn-off time period, said reference voltage remains at approximately said circuit ground potential.

2. The apparatus of claim 1, wherein said first amplifier comprises a differential amplifier.

3. The apparatus of claim 1, wherein:
   said reference generator comprises first and second current sources and a capacitor; and
   said first and second current sources are configured to charge and discharge said capacitor to produce said linearly changing reference voltage magnitudes during said turn-on and turn-off time periods.

4. The apparatus of claim 1, wherein said reference generator is further configured to provide said reference voltage such that during said turn-off time period subsequent to said on-time period said reference voltage magnitude changes linearly from said fixed reference voltage magnitude toward said circuit ground potential at a first voltage-versus-time rate until said reference voltage magnitude reaches a predetermined threshold voltage potential following which said reference voltage magnitude changes to said circuit ground potential at a second voltage-versus-time rate which is different from said first voltage-versus-time rate.

5. The apparatus of claim 4, wherein said reference generator comprises a control circuit configured to compare said linearly changing reference voltage magnitude to a comparison voltage potential and to turn off said first amplifier when said linearly changing reference voltage magnitude transcends said comparison voltage potential.

6. The apparatus of claim 4, wherein said reference generator comprises a control circuit configured to compare said linearly changing reference voltage magnitude to a comparison voltage potential and to change said changing of said reference voltage magnitude from said first voltage-versus-time rate to said second voltage-versus-time rate when said linearly changing reference voltage magnitude transcends said comparison voltage potential.

7. The apparatus of claim 4, wherein said second voltage-versus-time rate is slower than said first voltage-versus-time rate.

8. The apparatus of claim 4, wherein said second voltage-versus-time rate is non-linear.

9. The apparatus of claim 1, wherein:
said first amplifier has a gain associated therewith which is controlled by a control signal; and
said first amplifier gain, in accordance with said control signal, causes said selected multiple of said first input signal to be approximately zero during said turn-on and turn-off time periods.

10. The apparatus of claim 9, further comprising a controller, coupled to said first amplifier and said reference generator, configured to receive a fixed bias voltage and said reference voltage and in accordance therewith provide said control signal.

11. The apparatus of claim 10, wherein said controller comprises:
a multiple-state device, coupled to said first amplifier, configured to receive said control signal and in accordance therewith operate in one of a plurality of states, wherein said first amplifier gain is controlled by said plurality of states of said multiple-state device; and
a control circuit, coupled to said multiple-state device, configured to receive said fixed bias voltage and said reference voltage and in accordance therewith provide said control signal.

12. The apparatus of claim 11, wherein said multiple-state device comprises a switch.

13. The apparatus of claim 11, wherein said control circuit comprises a voltage comparator.

14. The apparatus of claim 1, wherein:
said first amplifier is further configured to operate in a first plurality of modes of operation to provide said first output signal; and
said first plurality of modes of operation is controlled by a control signal such that during said turn-on and turn-off time periods said reception of said first input signal by said first amplifier is disabled and said selected multiple of said first input signal is approximately zero and further such that during said on-time period said selected multiple of said first input signal is enabled to be non-zero.

15. The apparatus of claim 14, further comprising a controller, coupled to said first amplifier and said reference generator, configured to receive a fixed bias voltage and said reference voltage and in accordance therewith provide said control signal.

16. The apparatus of claim 15, wherein said controller comprises:
a multiple-state device, coupled to said first amplifier, configured to receive said control signal and in accordance therewith operate in one of a plurality of states, wherein said first plurality of modes of operation of said first amplifier are established in accordance with said plurality of states of said multiple-state device; and
a control circuit, coupled to said multiple-state device, configured to receive said fixed bias voltage and said reference voltage and in accordance therewith provide said control signal.

17. The apparatus of claim 16, wherein said multiple-state device comprises a switch.

18. The apparatus of claim 16, wherein said control circuit comprises a voltage comparator.

19. The apparatus of claim 1, wherein said amplifier circuit further comprises a second amplifier, coupled to said first amplifier, configured to be biased between said power supply voltage and said circuit ground potential, receive said reference voltage and receive a second input signal and in accordance therewith provide a second output signal which is approximately equal in magnitude to said first output signal during said turn-on and turn-off time periods and approximately equal in magnitude and inverse in phase to said first output signal during said on-time period.

20. The apparatus of claim 1, wherein:
said first amplifier is further configured to operate in a first plurality of modes of operation to provide said first output signal;
said amplifier circuit further comprises a second amplifier, coupled to said first amplifier, configured to be biased between said power supply voltage and said circuit ground potential, operate in a second plurality of modes of operation and receive a second input signal and in accordance therewith provide a second output signal which is approximately equal in magnitude to said first output signal during said turn-on and turn-off time periods and approximately equal in magnitude and inverse in phase to said first output signal during said on-time period; and
said first and second pluralities of modes of operation are controlled by a control signal such that during said turn-on and turn-off time periods said receptions of said first and second input signals by said first and second amplifiers, respectively, are disabled and said selected multiple of said first input signal is approximately zero and further such that during said on-time period said selected multiple of said first input signal is enabled to be non-zero.

21. The apparatus of claim 20, further comprising a controller, coupled to said first and second amplifiers and said reference generator, configured to receive a fixed bias voltage and said reference voltage and in accordance therewith provide said control signal.

22. The apparatus of claim 21, wherein said controller comprises:
first and second multiple-state devices, coupled to said first and second amplifiers, respectively, each configured to receive said control signal and in accordance therewith operate in one of a plurality of states, wherein said first and second pluralities of modes of operation of said first and second amplifiers are established in accordance with said pluralities of states of said first and second multiple-state devices, respectively; and a control circuit, coupled to said first and second multiple-state devices, configured to receive said fixed bias voltage and said reference voltage and in accordance therewith provide said control signal.

23. The apparatus of claim 22, wherein said first and second multiple-state devices comprise first and second switches.

24. The apparatus of claim 22, wherein said control circuit comprises a voltage comparator.

25. A method of operating an amplifier circuit for amplifying a signal while using a selectively variable reference voltage for reducing turn-on and turn-off transients, said method comprising the steps of:

biasing a first amplifier between a power supply voltage and a circuit ground potential;

receiving with said first amplifier a first input signal and a reference voltage having a selectively variable magnitude;

generating with said first amplifier a first output signal with a magnitude which varies in relation to and is approximately equal to a sum of said reference voltage and a selected multiple of said first input signal; and generating said reference voltage, wherein during a turn-on time period, said reference voltage magnitude changes linearly from approximately said circuit ground potential toward a fixed reference voltage magnitude, during an on-time period subsequent to said turn-on time period, said reference voltage remains at said fixed reference voltage magnitude, during a turn-off time period subsequent to said on-time period, said reference voltage magnitude changes linearly from said fixed reference voltage magnitude toward said circuit ground potential, and during an off time period subsequent to said turn-off time period, said reference voltage remains at approximately said circuit ground potential.

26. The method of claim 25, wherein said step of receiving with said first amplifier a first input signal and a reference voltage comprises receiving said first input signal and said reference voltage with a differential amplifier.

27. The method of claim 25, wherein said step of generating said reference voltage comprises charging and discharging a capacitor with first and second current sources to produce said linearly changing reference voltage magnitudes during said turn-on and turn-off time periods.

28. The method of claim 25, wherein said step of generating said reference voltage comprises generating said reference voltage such that during said turn-off time period subsequent to said on-time period said reference voltage magnitude changes linearly from said fixed reference voltage magnitude toward said circuit ground potential at a first voltage-versus-time rate until said reference voltage magnitude reaches a predetermined threshold voltage potential following which said reference voltage magnitude changes to said circuit ground potential at a second voltage-versus-time rate which is different from said first voltage-versus-time rate.

29. The method of claim 28, wherein said step of generating said reference voltage comprises:

comparing said linearly changing reference voltage magnitude to a comparison voltage potential; and turning off said first amplifier when said linearly changing reference voltage magnitude transcends said comparison voltage potential.

30. The method of claim 28, wherein said step of generating said reference voltage comprises:

comparing said linearly changing reference voltage magnitude to a comparison voltage potential; and changing said changing of said reference voltage magnitude from said first voltage-versus-time rate to said second voltage-versus-time rate when said linearly changing reference voltage magnitude transcends said comparison voltage potential.

31. The method of claim 28, wherein said step of generating said reference voltage comprises generating said reference voltage such that during said turn-off time period subsequent to said on-time period said reference voltage magnitude changes linearly from said fixed reference voltage magnitude toward said circuit ground potential at a first voltage-versus-time rate until said reference voltage magnitude reaches a predetermined threshold voltage potential following which said reference voltage magnitude changes to said circuit ground potential at a second voltage-versus-time rate which is slower than said first voltage-versus-time rate.

32. The method of claim 28, wherein said step of generating said reference voltage comprises generating said reference voltage such that during said turn-off time period subsequent to said on-time period said reference voltage magnitude changes linearly from said fixed reference voltage magnitude toward said circuit ground potential at a first voltage-versus-time rate until said reference voltage magnitude reaches a predetermined threshold voltage potential following which said reference voltage magnitude changes to said circuit ground potential at a second voltage-versus-time rate which is non-linear.

33. The method of claim 25, wherein said step of generating with said first amplifier a first output signal comprises:

generating said first output signal with a first amplifier having a controllable gain associated therewith; and controlling said first amplifier gain so as to cause said selected multiple of said first input signal to be approximately zero during said turn-on and turn-off time periods.

34. The method of claim 33, further comprising the step of receiving a fixed bias voltage and said reference voltage and in accordance therewith generating a control signal for use in said step of controlling said first amplifier gain.

35. The method of claim 34, wherein:

said step of controlling said first amplifier gain comprises operating a multiple-state device in one of a plurality of states in accordance with said control signal; and said first amplifier gain is controlled by said plurality of states of said multiple-state device.

36. The method of claim 35, wherein said step of operating a multiple-state device in one of a plurality of states comprises operating a switch.

37. The method of claim 35, wherein said step of receiving a fixed bias voltage and said reference voltage and in accordance therewith generating a control signal comprises comparing said fixed bias voltage and said reference voltage with a voltage comparator and in accordance therewith generating said control signal.

38. The method of claim 25, further comprising the steps of:

operating said first amplifier in a first plurality of modes of operation for generating said first output signal;

controlling said first plurality of modes of operation such that during said turn-on and turn-off time periods said reception of said first input signal by said first amplifier is disabled and said selected multiple of said first input signal is approximately zero and further such that during said on-time period said selected multiple of said first input signal is enabled to be non-zero.

39. The method of claim 38, further comprising the step of receiving a fixed bias voltage and said reference voltage and in accordance therewith generating a control signal for use in said step of controlling said first plurality of modes of operation.

40. The method of claim 39, wherein:

said step of operating said first amplifier in a first plurality of modes of operation for generating said first output signal comprises operating a multiple-state device in one of a plurality of states in accordance with said control signal; and said first plurality of modes of operation of said first amplifier are established in accordance with said plurality of states of said multiple-state device.

41. The method of claim 40, wherein said step of operating a multiple-state device in one of a plurality of states comprises operating a switch.

42. The method of claim 40, wherein said step of receiving a fixed bias voltage and said reference voltage and in accordance therewith generating a control signal comprises comparing said fixed bias voltage and said reference voltage with a voltage comparator and in accordance therewith generating said control signal.

43. The method of claim 25, further comprising the steps of:

biasing a second amplifier between said power supply voltage and said circuit ground potential;

receiving with said second amplifier said reference voltage and a second input signal; and generating with said second amplifier a second output signal which is approximately equal in magnitude to said first output signal during said turn-on and turn-off time periods and approximately equal in magnitude and inverse in phase to said first output signal during said on-time period.

44. The method of claim 25, further comprising the steps of:

operating said first amplifier in a first plurality of modes of operation for generating said first output signal;

biasing a second amplifier between said power supply voltage and said circuit ground potential;

operating said second amplifier in a second plurality of modes of operation;

receiving a second input signal with said second amplifier and in accordance therewith generating a second output signal which is approximately equal in magnitude to said first output signal during said turn-on and turn-off time periods and approximately equal in magnitude and inverse in phase to said first output signal during said on-time period; and controlling said first and second pluralities of modes of operation such that during said turn-on and turn-off time periods said receptions of said first and second input signals by said first and second amplifiers, respectively, are disabled and said selected multiple of said first input signal is approximately zero and further such that during said on-time period said selected multiple of said first input signal is enabled to be non-zero.

45. The method of claim 44, further comprising the step of receiving a fixed bias voltage and said reference voltage and in accordance therewith generating a control signal for use in said step of controlling said first and second pluralities of modes of operation.

46. The method of claim 45, wherein:

said steps of operating said first and second amplifiers in first and second pluralities of modes of operation for generating said first and second output signals, respectively, comprise operating each of first and second multiple-state devices in one of a plurality of states in accordance with said control signal; and said first and second pluralities of modes of operation of said first and second amplifiers are established in accordance with said pluralities of states of said first and second multiple-state devices, respectively.

47. The method of claim 46, wherein said step of operating each of first and second multiple-state devices in one of a plurality of states comprises operating first and second switches.

48. The method of claim 46, wherein said step of receiving a fixed bias voltage and said reference voltage and in accordance therewith generating a control signal comprises comparing said fixed bias voltage and said reference voltage with a voltage comparator and in accordance therewith generating said control signal.

* * * * *

UNITED STATES PATENT AND TRADEMARK OFFICE
CERTIFICATE OF CORRECTION

PATENT NO.: 5,939,938
DATED: August 17, 1999
INVENTOR(S): Arthur Joseph Kalb et al.

It is certified that errors appear in the above-identified patent and that said Letters Patent is hereby corrected as shown below:

On the cover page, at [75], delete "Santa Clara" and replace with --Saratoga--.

On the cover page, at [73], delete "Sata Clara" and replace with --Santa Clara--.

Signed and Sealed this

Eighteenth Day of January, 2000

Attest:

Q. TODD DICKINSON

*Attesting Officer*    *Commissioner of Patents and Trademarks*